United States Patent
Kanai et al.

(10) Patent No.: US 9,743,568 B2
(45) Date of Patent: Aug. 22, 2017

(54) REEL FOR COMPONENT MOUNTING APPARATUS AND COMPONENT SUPPLYING METHOD IN COMPONENT MOUNTING APPARATUS

(71) Applicant: PANASONIC CORPORATION, Osaka (JP)

(72) Inventors: Kazunori Kanai, Yamanashi (JP); Masayuki Kuwabara, Yamanashi (JP); Hiroto Miyazaki, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 161 days.

(21) Appl. No.: 14/474,473

(22) Filed: Sep. 2, 2014

(65) Prior Publication Data
US 2015/0059171 A1    Mar. 5, 2015

(30) Foreign Application Priority Data

Sep. 5, 2013    (JP) .................................. 2013-183826

(51) Int. Cl.
B23P 19/00    (2006.01)
H05K 13/04    (2006.01)
H05K 13/00    (2006.01)

(52) U.S. Cl.
CPC ..... H05K 13/0417 (2013.01); H05K 13/0084 (2013.01); *Y10T 29/4913* (2015.01); *Y10T 29/53178* (2015.01)

(58) Field of Classification Search
CPC ............ H05K 13/0417; H05K 13/0084; Y10T 29/53178; Y10T 29/4913
(Continued)

(56) References Cited

U.S. PATENT DOCUMENTS 4,653,664 A * 3/1987 Hineno .............. H05K 13/0417
                                                        221/3
6,086,010 A * 7/2000 Kayser .................. B65H 18/20
                                                       242/521
(Continued)

FOREIGN PATENT DOCUMENTS

JP      04-031259 A       2/1992
JP        04031259 A  *   2/1992
JP     2011-211169 A     10/2011

OTHER PUBLICATIONS

Japanese Office Action for Application No. 2013-183826 dated May 10, 2016.

*Primary Examiner* — Peter DungBa Vo
*Assistant Examiner* — Azm Parvez
(74) *Attorney, Agent, or Firm* — Pearne & Gordon, LLP (57) ABSTRACT

A reel for a component mounting apparatus that pulls a carrier tape out of the reel and pitch-feeds and supplies the carrier tape by a tape feeder in a component supply part and picks up a supplied component and mounts the component in a substrate by a mounting head. The reel includes: a reel core part; and the carrier tape being wound and stored around the reel core part, wherein the carrier tape includes a distal end fixed to the reel core part, and a brittle part that is positioned in the vicinity of the distal end and is broken by action of longitudinal tension in excess of a prescribed strength on the carrier tape, and the pitch-feed separates the carrier tape from the reel core part at the brittle part.

6 Claims, 10 Drawing Sheets

(58) Field of Classification Search
USPC .................................. 29/729, 739, 740, 700
See application file for complete search history.

(56) References Cited

U.S. PATENT DOCUMENTS

| | | | | |
|---|---|---|---|---|
| 6,157,870 A | * | 12/2000 | Gfeller | ............... H05K 13/0417 |
| | | | | 221/73 |
| 2008/0038501 A1 | * | 2/2008 | Velasquez Urey | ...... C09J 7/026 |
| | | | | 428/43 |
| 2011/0243695 A1 | | 10/2011 | Hwang et al. | |

* cited by examiner

REEL FOR COMPONENT MOUNTING APPARATUS AND COMPONENT SUPPLYING METHOD IN COMPONENT MOUNTING APPARATUS

CROSS REFERENCE TO RELATED APPLICATION(S)

The present disclosure relates to the subject matters contained in Japanese Patent Application No. 2013-183826 filed on Sep. 5, 2013, which are incorporated herein by reference in its entirety.

FIELD

An embodiment of the present invention relates to a reel for a component mounting apparatus in which a carrier tape is wound and stored, and a component supplying method in the component mounting apparatus for pulling the carrier tape out of this reel and supplying a component.

BACKGROUND

When a component held in a carrier tape is supplied in a component mounting apparatus, a tape feeder is used. The carrier tape is wound and stored in a reel and is pulled out by the tape feeder and is pitch-fed to thereby be moved in a take-out position by a mounting head. When a carrier tape of one reel is consumed and a tape feeder is replenished with a component, splicing in which a subsequent tape stored in a new reel is spliced to a preceding tape in use attached to the tape feeder is performed. Since splicing work is work of joining two carrier tapes together while making a check of a pitch or alignment, a worker is forced to do complicated and time-consuming work in each case of being replenished with the component. In order to reduce such a burden on the worker, a splicing-less feeder for making a subsequent tape follow from the back of a preceding tape and supplying the subsequent tape to a tape feeder without joining two carrier tapes together has been proposed (for example, see Patent Reference 1).

Patent Reference 1 is JP-A-2011-211169.

SUMMARY

Incidentally, in a reel for a component mounting apparatus in which a carrier tape is wound and stored in the reel, the distal end of the carrier tape is fixed to a reel core part by a method of folding, sticking, etc. As a result, when the carrier tape stored in one reel is consumed and this reel is detached from a tape feeder, it is necessary to separate the carrier tape from the reel core part to which the distal end is fixed. In the case of reel replacement for component replenishment, it is necessary to do complicated work in which, for example, a worker cuts the distal end of the carrier tape by hand work. Because of this, even when the splicing-less feeder is adopted for the purpose of improving workability and productivity, the hand work of cutting the distal end of the preceding tape is still required in each case of being replenished with the component. As a result, a desired effect may not be obtained.

Hence, the embodiment of the invention aims to provide a reel for a component mounting apparatus capable of easily separating a carrier tape from a reel core part to which the distal end is fixed, and a component supplying method in the component mounting apparatus.

According to the embodiment of the invention, there is provided a reel for a component mounting apparatus that pulls a carrier tape out of the reel and pitch-feeds and supplies the carrier tape by a tape feeder in a component supply part and picks up a supplied component and mounts the component in a substrate by a mounting head, the reel including: a reel core part; and the carrier tape being wound and stored around the reel core part, wherein the carrier tape includes a distal end fixed to the reel core part, and a brittle part that is positioned in the vicinity of the distal end and is broken by action of longitudinal tension in excess of a prescribed strength on the carrier tape, and the pitch-feed separates the carrier tape from the reel core part at the brittle part.

According to the embodiment of the invention, there is provided a component supplying method in a component mounting apparatus, the method including: in a component supply part, pulling a carrier tape out of a reel and pitch-feeding and supplying the carrier tape by a tape feeder, the carrier tape including a distal end fixed to a reel core part of the reel, and a brittle part that is positioned in the vicinity of the distal end and is broken by action of longitudinal tension in excess of a prescribed strength on the carrier tape; picking up a supplied component and mounting the component in a substrate by a mounting head; and separating the carrier tape from the reel core part at the brittle part by the pitch-feed.

According to the embodiment of the invention, the brittle part that is positioned in the vicinity of the distal end fixed to the reel core part and is broken by action of the longitudinal tension in excess of the prescribed strength on the carrier tape is formed in the carrier tape and thereby, the carrier tape can be separated from the reel core part at the brittle part by the tension acting in pitch-feeding the carrier tape, and the carrier tape can easily be separated from the reel core part to which the distal end is fixed.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EMBODIMENTS

Next, an embodiment of the invention will be described with reference to the drawings. First, a configuration of a component mounting apparatus 1 for mounting an electronic component in a substrate will be described with reference to FIGS. 1 and 2. The component mounting apparatus 1 has a function of mounting the electronic component such as a semiconductor chip in the substrate, and FIG. 2 partially shows a cross section of line A-A in FIG. 1.

Figure 1:
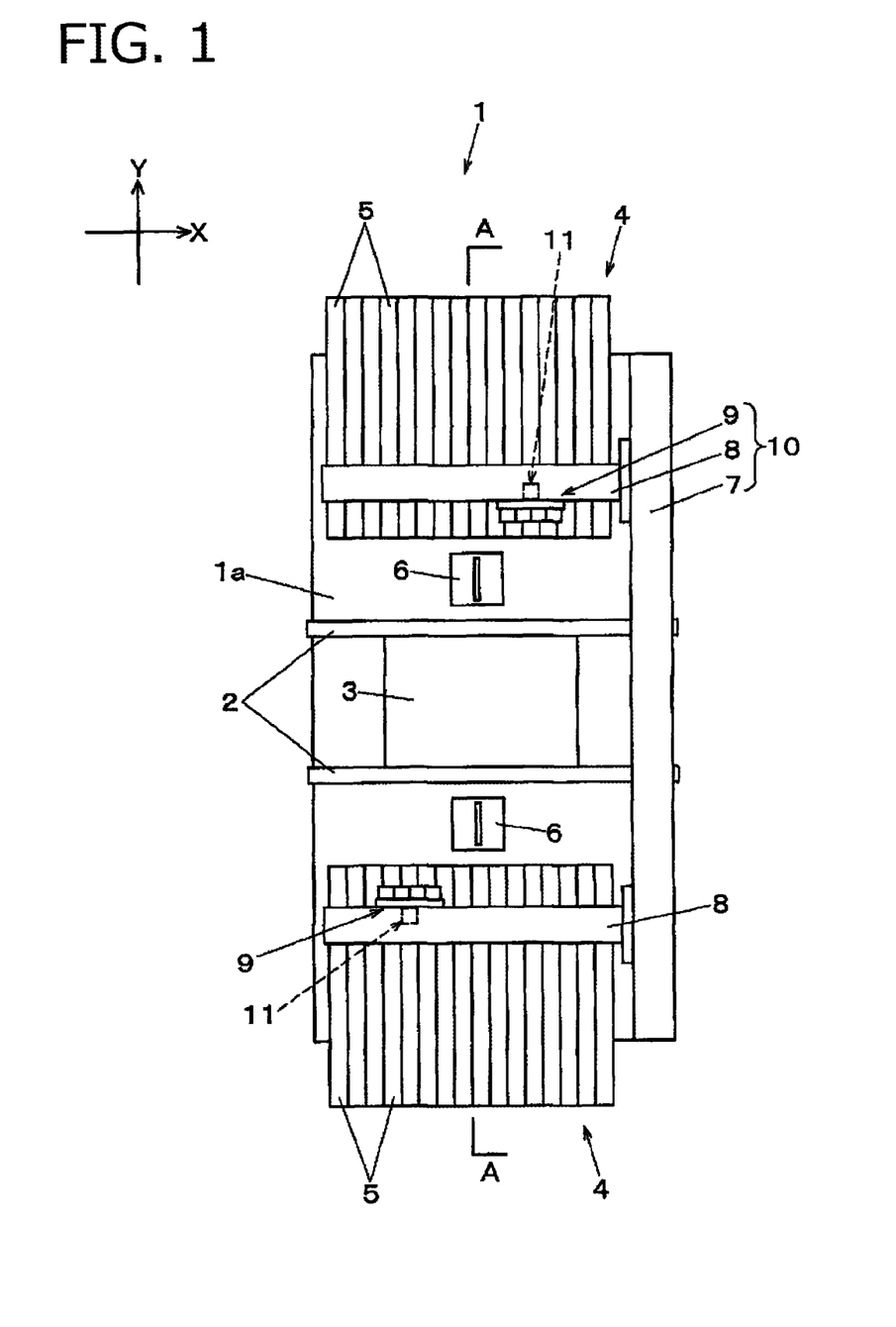
FIG. 1 is a plan view of a component mounting apparatus of an embodiment of the invention.

In FIG. 1, a substrate conveyance mechanism 2 is arranged in the center of a base 1a in an X direction (substrate conveyance direction). The substrate conveyance mechanism 2 conveys a substrate 3 carried from the upstream side, and positions and holds the substrate 3 in a mounting stage set in order to do component mounting work. Component supply parts 4 are arranged in both sides of substrate conveyance mechanism 2, and plural tape feeders 5 are attached parallel to each of the component supply parts 4. The tape feeder 5 pitch-feeds a carrier tape in which an electronic component is stored in a tape feed direction, that is, a direction from the outside of the component supply part 4 toward the substrate conveyance mechanism 2 and thereby, the electronic component is supplied in a component suction position by a mounting head of a component mounting mechanism described below.

A Y-axis movement table 7 including a linear driving mechanism is arranged in the end of one side in the X direction on an upper surface of the base 1a, and two X-axis movement tables 8 including linear driving mechanisms similarly are coupled to the Y-axis movement table 7 movably in a Y direction. Mounting heads 9 are respectively attached to the two X-axis movement tables 8 movably in the X direction. The mounting head 9 is a multiple type head including plural holding heads, and a suction nozzle 9a capable of sucking and holding and individually moving upwardly and downwardly the electronic component is attached to the lower end of each of the holding heads as shown in FIG. 2.

The mounting head 9 is moved in the X direction and the Y direction by driving the Y-axis movement table 7 and the X-axis movement table 8. Accordingly, the two mounting heads 9 take the electronic components out of the component suction positions of the tape feeders 5 of the component supply parts 4 corresponding respectively by the suction nozzles 9a, and transfer and mount the electronic components in mounting points of the substrate 3 positioned in the substrate conveyance mechanism 2. The Y-axis movement table 7, the X-axis movement tables 8 and the mounting heads 9 construct a component mounting mechanism 10 for transferring and mounting the electronic components to the substrate 3 by moving the mounting heads 9 holding the electronic components.

Component recognition cameras 6 are arranged between the component supply parts 4 and the substrate conveyance mechanism 2. When the mounting head 9 taking the electronic component out of the component supply part 4 is moved over the component recognition camera 6, the component recognition camera 6 images and recognizes the electronic component with the electronic component held in the mounting head 9. A substrate recognition camera 11 positioned in the lower surface side of the X-axis movement table 8 and moved integrally to the mounting head 9 is attached to each of the mounting heads 9. By moving the mounting head 9, the substrate recognition camera 11 is moved over the substrate 3 positioned in the substrate conveyance mechanism 2, and images and recognizes the substrate 3. In component mounting operation to the substrate 3 by the mounting head 9, a mounting position correction is made by adding a recognition result of the electronic component by the component recognition camera 6 to a substrate recognition result by the substrate recognition camera 11.

Figure 2:
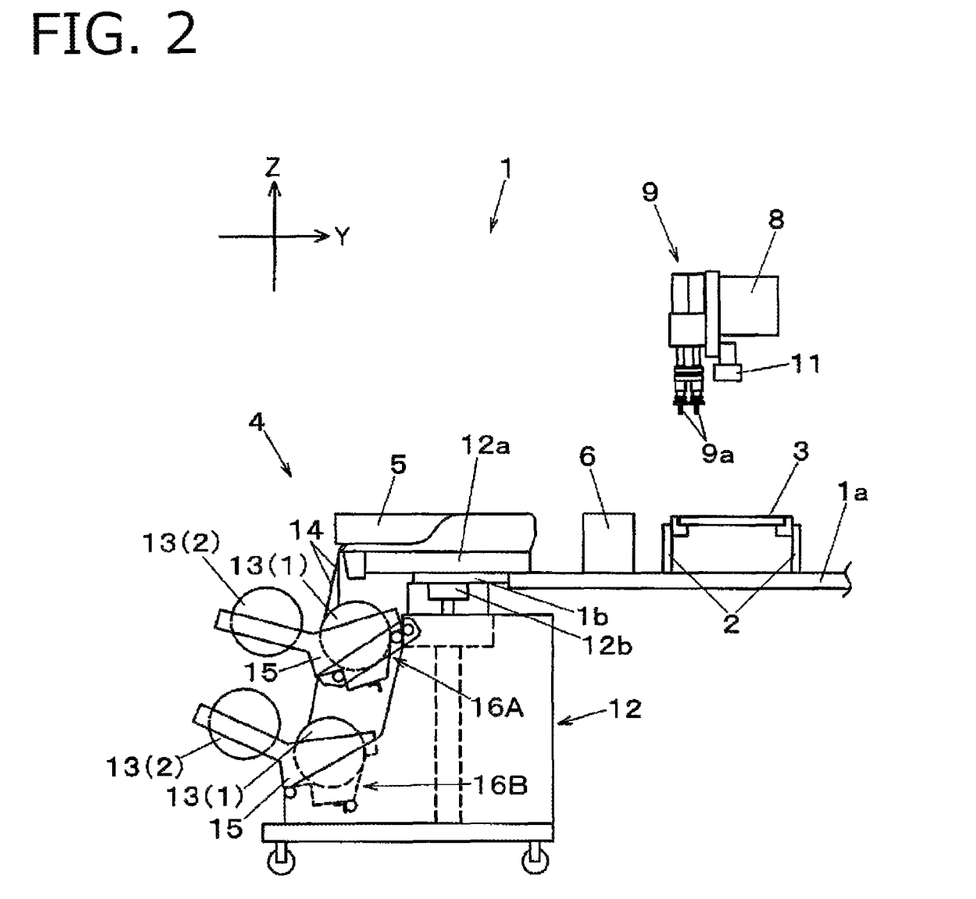
FIG. 2 is a partially sectional view of the component mounting apparatus of the embodiment of the invention.

As shown in FIG. 2, a cart 12 in a state in which the plural tape feeders 5 are previously attached to a feeder base 12a is set in the component supply part 4. The feeder base 12a is clamped to a fixed base 1b formed on the base 1a by a clamp mechanism 12b to thereby fix a position of the cart 12 in the component supply part 4. A reel 13 for storing a carrier tape 14 holding the electronic components in a wound state is held in the cart 12. The carrier tape 14 pulled out of the reel 13 is pitch-fed to the component suction position by suction nozzles 9a by means of the tape feeder 5.

The present embodiment adopts a splicing-less method in which the tape feeder 5 does not perform splicing of joining the carrier tapes 14 together in the case of switching the reel 13 for component replenishment. And, the cart 12 set in the component supply part 4 is provided with a holding mechanism capable of holding the reel 13. Here, the holding mechanism is configured to hold reel holders 15 for holding the two reels 13 respectively in a first holding mechanism 16A and a second holding mechanism 16B arranged vertically.

Figure 3:
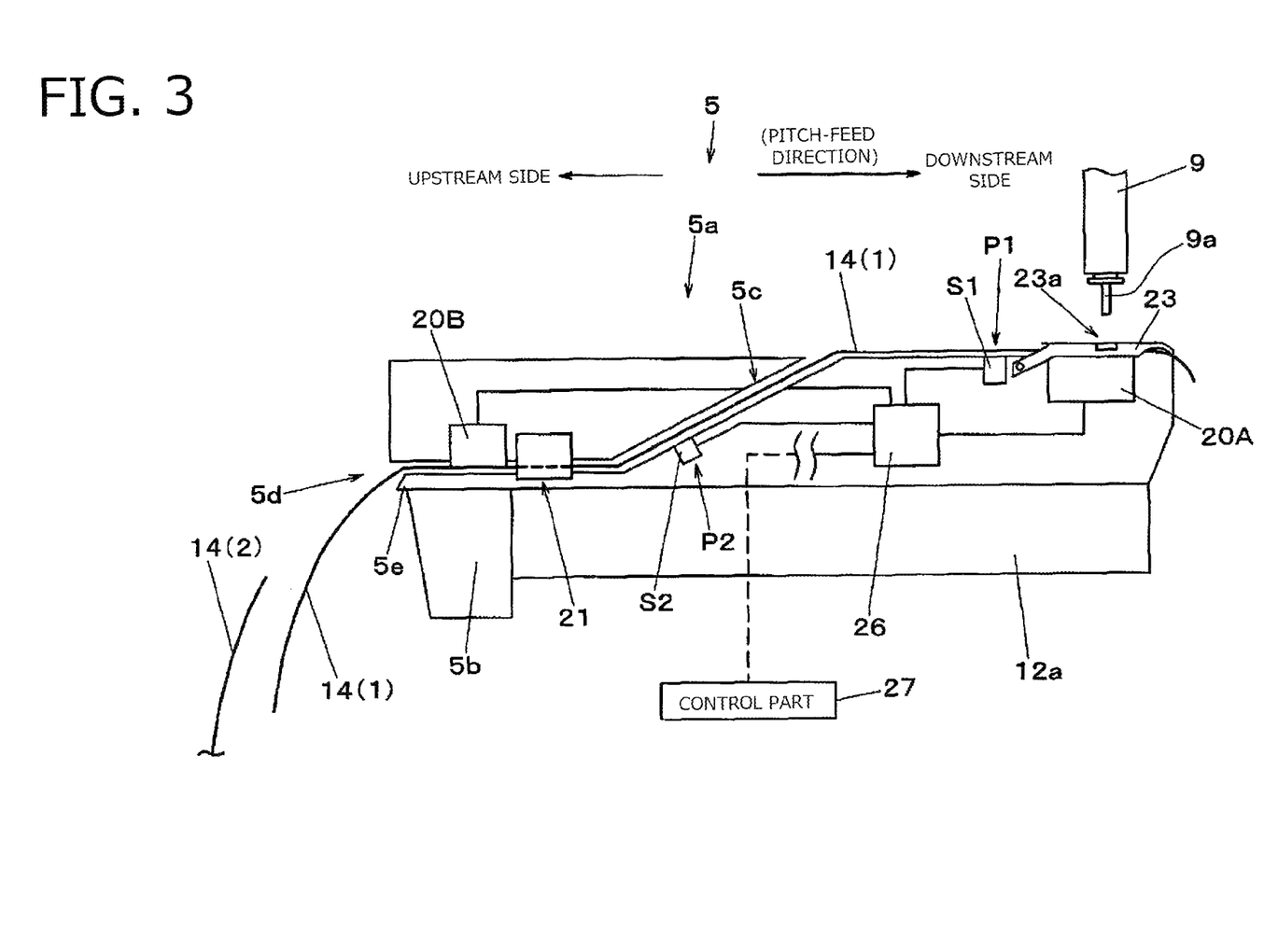
FIG. 3 is a configuration explanatory diagram of a tape feeder of the embodiment of the invention.

That is, the reel holder 15 integrally holds a first reel 13(1) for supplying a carrier tape 14(1) (see FIGS. 3 and 4B, and hereinafter abbreviated as a preceding tape 14(1)) already attached to the tape feeder 5, and a second reel 13(2) for supplying a carrier tape 14(2) (see FIGS. 3 and 4B, and hereinafter abbreviated as a subsequent tape 14(2)) newly attached in the case of the absence of a component.

By vertically arranging the first holding mechanism 16A and the second holding mechanism 16B, the reels 13 used in the plural tape feeders 5 attached in parallel can be staggered vertically, and the reels 13 with a reel width wider than a feeder width can be arranged without causing mutual interference in correspondence with the respective tape feeders 5.

Next, a configuration and a function of the tape feeder 5 will be described with reference to FIG. 3. As shown in FIG. 3, the tape feeder 5 includes a body part 5a and an attachment part 5b downwardly projected from a lower surface of the body part 5a. In a state in which the tape feeder 5 is attached to the feeder base 12a so that the lower surface of the body part 5a is applied to the feeder base 12a and, a connector part (not shown) formed on the attachment part 5b is fitted into the feeder base 12a. Accordingly, the tape feeder 5 is fixed and attached to the component supply part 4 and also, a tape feed control part 26 incorporated in order to perform tape feed control in the tape feeder 5 is electrically connected to a control part 27 of the component mounting apparatus 1.

The inside of the body part 5a is provided with a tape travel path 5c for guiding the carrier tape 14 pulled out of the reel 13 and taken inside the body part 5a. The tape travel path 5c is formed in communication from a tape inlet 5d opened between the upstream end of the body part 5a and an extension part 5e in which the lower end of the body part 5a extends to the upstream side to the component suction position in which an electronic component is taken out by the mounting head 9. In a process of continuously doing component mounting work, the plural carrier tapes 14 using the amount of storing in one reel 13 as a unit lot are sequentially inserted from the tape inlet 5d and are supplied to the tape feeder 5.

The downstream side and the upstream side in the tape travel path 5c are provided with a first tape feed mechanism 20A and a second tape feed mechanism 20B, respectively. Both of the first tape feed mechanism 20A and the second tape feed mechanism 20B are configured to pitch-feed the carrier tape 14 by rotating and driving a sprocket provided with feed pins fitted into feed holes formed in the carrier tape 14 by a feed motor.

The first tape feed mechanism 20A formed in the downstream side in the tape travel path 5c pitch-feeds the carrier tape 14 in the component suction position by the mounting head 9. A tape press member 23 is arranged over the first tape feed mechanism 20A, and the carrier tape 14 pitch-fed by the first tape feed mechanism 20A is pressed from the upper side by the tape press member 23 and is guided. Then, the electronic component held in the carrier tape 14 is taken out by the suction nozzle 9a of the mounting head 9 through a take-out opening 23a formed in the tape press member 23 in correspondence with the component suction position.

Also, the second tape feed mechanism 20B formed in the upstream side in the tape travel path 5c has a function of feeding the carrier tape 14 introduced from the tape inlet 5d to the downstream side. The upstream side of the second tape feed mechanism 20B is provided with a tape stopper mechanism 21 having a stopper function of switching tape feed prohibition and permission of a subsequent tape at the time of additional supply of the carrier tape 14. By this stopper function, the subsequent tape fed to the tape feeder 5 without performing tape splicing can be made to wait and stop until passage of a preceding tape is completed.

A first detecting position P1 for detecting the carrier tape 14 is set in the vicinity of the component suction position of the upstream side of the first tape feed mechanism 20A in the tape travel path 5c, and a second detecting position P2 for detecting the carrier tape 14 is similarly set in the downstream side of the second tape feed mechanism 20B and the upstream side beyond the first detecting position P1. A first tape detecting sensor S1 and a second tape detecting sensor S2 respectively arranged in the first detecting position P1 and the second detecting position P2 detect the presence or absence of the carrier tape 14 in the first detecting position P1 and the second detecting position P2.

The results of detection by the first tape detecting sensor S1 and the second tape detecting sensor S2 are transmitted to the tape feed control part 26, and the tape feed control part 26 controls the first tape feed mechanism 20A and the second tape feed mechanism 20B based on these results of detection. The second tape feed mechanism 20B incorporates a one-way clutch mechanism for permitting a slip in only a direction corresponding to a tape feed direction from the upstream side to the downstream side and prohibiting a slip in the opposite direction, and a disconnecting mechanism for disconnecting driving transmission to a sprocket from a motor. Then, switching between a slip mode of permitting a slip in the direction corresponding to the tape feed direction and stopping the carrier tape 14 in the second tape feed mechanism 20B and a driving mode of feeding the carrier tape 14 by the second tape feed mechanism 20B is performed by controlling the one-way clutch mechanism and the motor by the tape feed control part 26.

In the embodiment, the first tape detecting sensor S1 and the second tape detecting sensor S2 respectively detect respective tail ends E and head ends T of the preceding tape 14(1) fed antecedently and the subsequent tape 14(2) fed subsequently in the two carrier tapes 14 fed in tandem (see FIGS. 8 and 9). Then, the tape feed control part 26 controls the first tape feed mechanism 20A and the second tape feed mechanism 20B based on the results of detection of the tail ends E and the head ends T by the first tape detecting sensor S1 and the second tape detecting sensor S2 to thereby control a distance between the tail end E and the head end T in the tape travel path 5c by a preset distance control pattern.

Figure 4A:
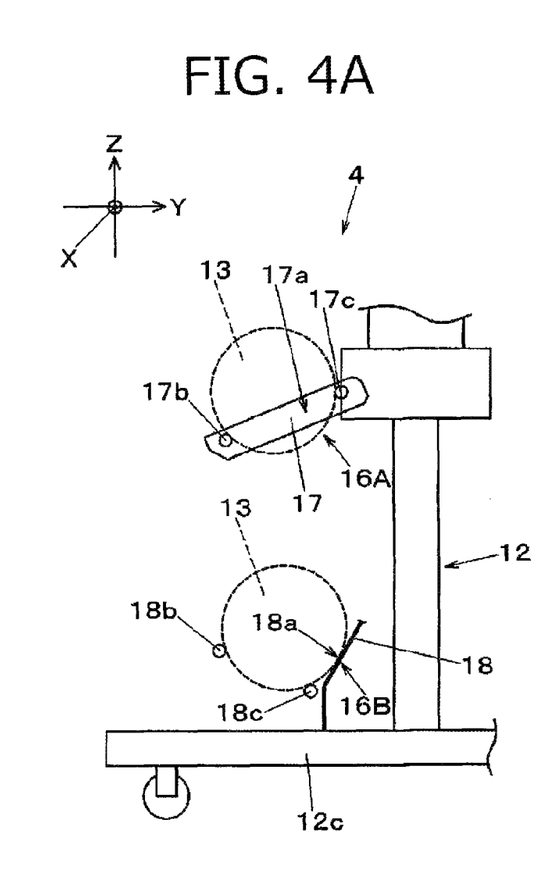
FIGS. 4A and 4B are configuration explanatory diagrams of a component supply part in the component mounting apparatus of the embodiment of the invention.

Next, a function of the reel holder 15 used in the case of holding the reel 13 in which the carrier tape 14 is wound and stored in the cart 12 set in the component supply part 4 will be described with reference to FIGS. 4A and 4B. First, FIG. 4A shows a state in which the cart 12 holds the single reel 13 in each of the first holding mechanism 16A and the second holding mechanism 16B inherently included in order to hold the reel 13.

The first holding mechanism 16A is configured to form support pins 17b, 17c for abutting on the outer peripheral edge of the reel 13 and supporting the reel 13 on both ends of a holding member 17 configured to parallel arrange a pair of plate members and form a fit-in part 17a into which the reel 13 can be fitted. In holding the target reel 13, the reel 13 is fitted into the fit-in part 17a and is supported by the support pins 17b, 17c thereby the reel 13 is held in the first holding mechanism 16A.

The second holding mechanism 16B includes a wall member 18 formed in communication in an X direction (direction vertical to a paper plane) in a shape inclined in a Y direction on the bottom 12c of the cart 12, and a pair of support members 18b, 18c which supports the reel 13 in the outside of the wall member 18 and is arranged in a predetermined position. In holding the target reel 13, the reel 13 is abutted on an inclined holding surface 18a of the wall member 18 and also the reel 13 is supported by the support members 18b, 18c thereby the reel 13 is held in the second holding mechanism 16B. That is, in the component mounting apparatus 1 targeted for the embodiment, each of the first holding mechanism 16A and the second holding mechanism 16B is formed so that the single reel 13 can be held in the component supply part 4.

Figure 4B:
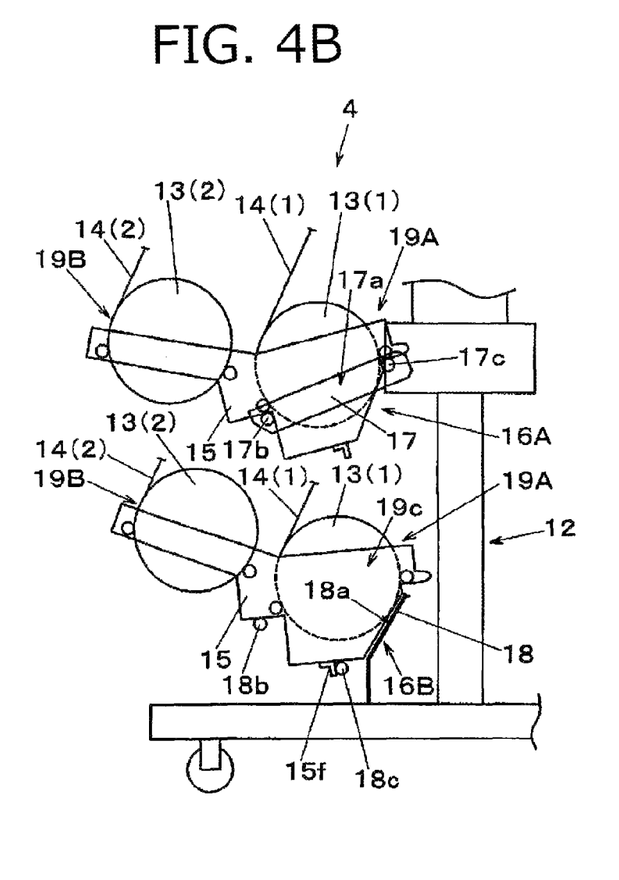

FIG. 4B shows a configuration in which the two reels 13 are respectively held in the first holding mechanism 16A and the second holding mechanism 16B configured as described above through the reel holders 15. That is, the reel holders 15 are configured to be attached to the component supply part 4 of the component mounting apparatus 1 and hold the two reels of a first reel 13(1) and a second reel 13(2) in which the carrier tapes 14 are wound and stored and be integrally attached to and detached from the first holding mechanism 16A and the second holding mechanism 16B. The first reel 13(1) is a presently used reel for supplying the preceding tape 14(1) already attached to the tape feeder 5, and the second reel 13(2) is a spare reel used after the carrier tape 14 stored in the first reel 13(1) is used up.

The embodiment adopts the splicing-less method for performing component replenishment without joining together the preceding tape 14(1) pulled out of the first reel 13(1) and the subsequent tape 14(2) pulled out of the second reel 13(2), and the start end of the subsequent tape 14(2)

overlapped with the tail end of the preceding tape 14(1) is inserted into the tape feeder 5 to thereby supply the tape continuously.

Figure 5A:
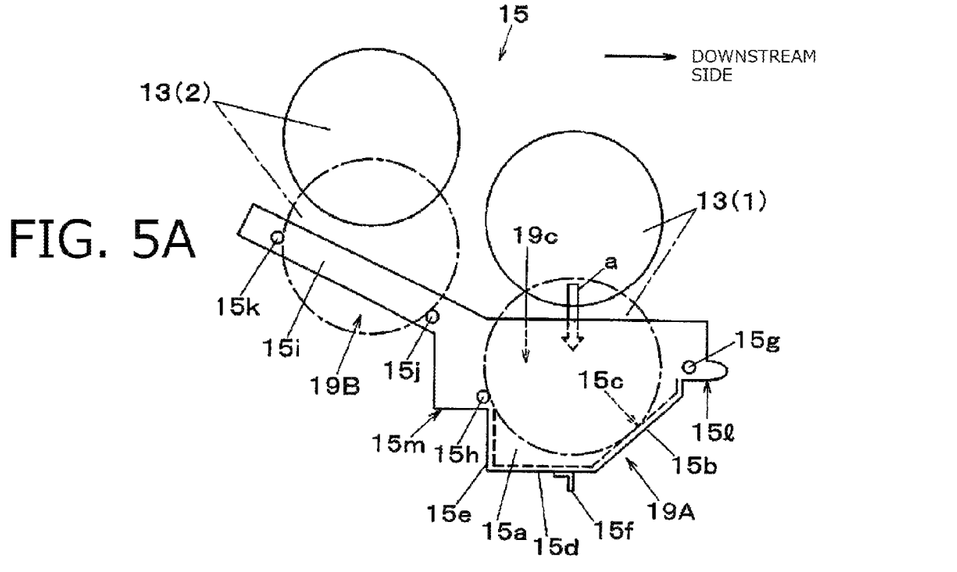
FIGS. 5A to 5C are structural explanatory diagrams of a reel holder used in the component supply part of the component mounting apparatus of the embodiment of the invention.
Figure 5B:
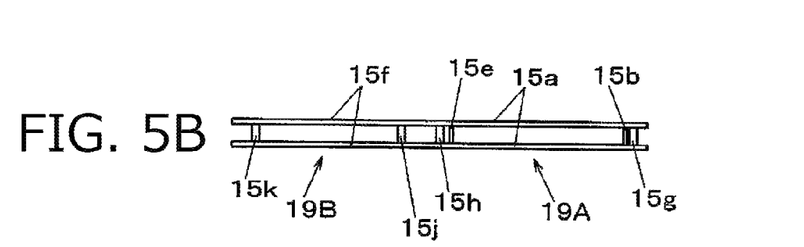

Here, a detailed configuration of the reel holder 15 will be described with reference to FIGS. 5A to 5C. As shown in FIGS. 5A and 5B, the reel holder 15 has a first reel holding part 19A for holding the first reel 13(1) described above and a second reel holding part 19B for holding the second reel 13(2). The first reel holding part 19A mainly has storage space 19c in which a lower part of space formed inside a pair of substantially pentagonal side plate parts 15a oppositely arranged in parallel is closed and surrounded by the bottoms made of three bottom surfaces. These bottom surfaces are formed in the shape in which an inclined bottom plate part 15b with a shape higher toward the downstream end side, a horizontal bottom plate part 15d with a horizontal shape and a vertical bottom plate part 15e with a vertical shape are coupled sequentially from the downstream side, and both ends of the side plate parts 15a are coupled by coupling support pins 15g, 15h.

The first reel 13(1) is stored in the storage space 19c of the first reel holding part 19A (arrow a) and the outer peripheral edge of the first reel 13(1) is abutted on the coupling support pin 15h and an abutting surface 15c of an inner surface of the inclined bottom plate part 15b thereby the first reel 13(1) is held by the first reel holding part 19A. Further, an abutting surface 15l and an abutting surface 15m which are positioned in the front end and the back end of the side plate part 15a and respectively abut on support pins 17c, 17b in a state set in the first holding mechanism 16A are formed in the first reel holding part 19A. And, a locking projection 15f locked in the support member 18c in a state set in the second holding mechanism 16B is projected on a lower surface of the horizontal bottom plate part 15d.

Also, the second reel holding part 19B is configured to form fitting space into which the reel 13 can be fitted by arranging parallel a pair of plate members 15i and to couple both ends of the plate members 15i by coupling support pins 15j, 15k. The second reel 13(2) is stored in the fitting space of the second reel holding part 19B (arrow b) and the outer peripheral edge of the second reel 13(2) is abutted on the coupling support pins 15j, 15k thereby the second reel 13(2) is held by the second reel holding part 19B.

Figure 5C:
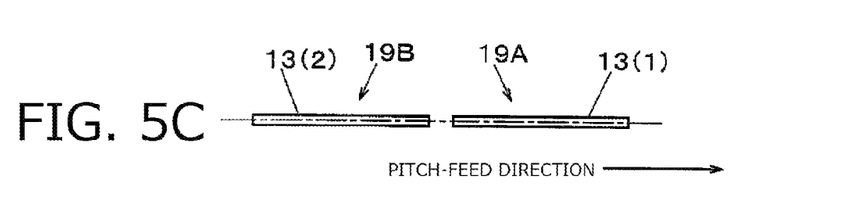

In this holding state, the first reel 13(1) and the second reel 13(2) held in the reel holder 15, that is, the first reel holding part 19A and the second reel holding part 19B, are arranged in series using a pitch-feed direction of the carrier tape 14 as an arrangement direction as shown in FIG. 5C. Accordingly, even in the case of arranging the plural reels 13 per tape feeder 5, an occupation width in an X direction in which space is limited can be minimized in the component supply part 4 and downsizing of equipment is ensured.

In this manner, the reel holders 15 holding the first reel 13(1) and the second reel 13(2) are detachably held integrally to the first holding mechanism 16A and the second holding mechanism 16B of the cart 12 as shown in FIG. 4B. That is, when the reel holder 15 is held in the first holding mechanism 16A, the first reel holding part 19A is fitted into the fit-in part 17a and also the abutting surfaces 15l, 15m (see FIG. 5A) of the reel holder 15 are supported by the support pins 17b, 17c.

That is, it is constructed so that the first reel holding part 19A can be fitted into the fit-in part 17a formed in order to hold the first reel 13(1) in the first holding mechanism 16A. Also, when the reel holder 15 is held in the second holding mechanism 16B, the inclined bottom plate part 15b of the first reel holding part 19A is abutted on the inclined holding surface 18a and also the locking projection 15f is locked in the support member 18c and further the abutting surface 15m of the reel holder 15 is supported by the support member 18b (see FIGS. 4A and 4B).

In the configuration described above, the first reel holding part 19A is configured detachably from each of the first holding mechanism 16A and the second holding mechanism 16B. Accordingly, the reel holder 15 can be attached to both of the first holding mechanism 16A and the second holding mechanism 16B. Since it is constructed so as not to cause interference between the mutual reels 13 as described above at this time, the plural reels 13 can be arranged while saving space.

Figure 6A:
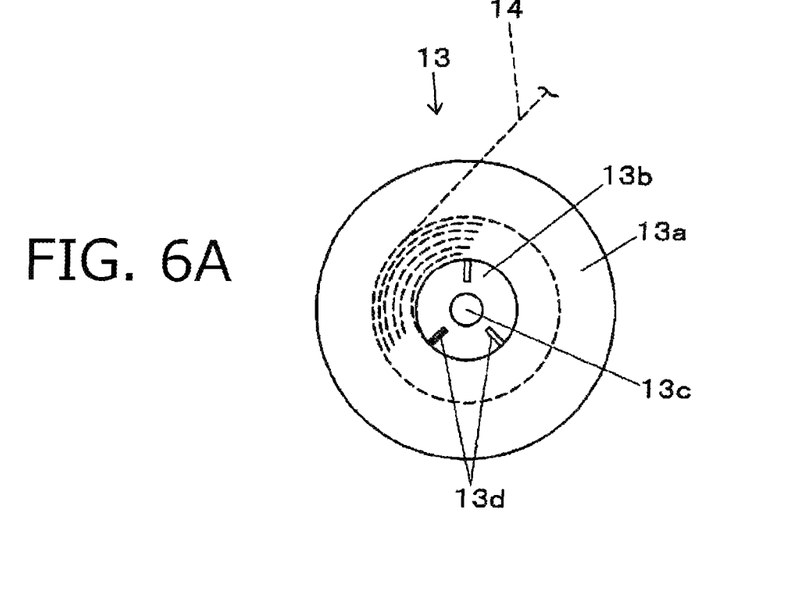
FIGS. 6A and 6B are configuration explanatory diagrams of a reel used in the component supply part of the component mounting apparatus of the embodiment of the invention.

Next, a configuration of the reel 13 for the component mounting apparatus in which the carrier tape 14 is wound and stored in the embodiment will be described with reference to FIGS. 6A and 6B. As shown in FIG. 6A, the center of the reel 13 configured to oppose a pair of circular reel side plates 13a is provided with a reel core part 13b. The center of the reel core part 13b is provided with an axial support hole 13c for axial support, and fixing slits 13d for fixing a distal end 14E of the carrier tape 14 are formed in an outer peripheral part of the reel core part 13b. A predetermined amount of the carrier tape 14 for holding an electronic component targeted for supply is wound and stored in the reel 13, and is held in the component supply part 4 of the component mounting apparatus 1 in this state.

Figure 6B:
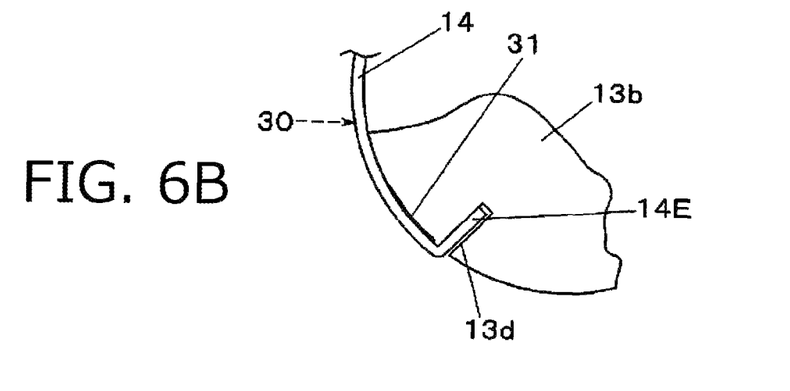

FIG. 6B shows a state in which the distal end 14E of the carrier tape 14 wound and stored is fixed to the reel core part 13b. That is, the distal end 14E of the carrier tape 14 stored in the reel 13 is bent and inserted into the fixing slit 13d cut in a slit shape radially in the reel core part 13b and is further stuck and fixed on an outer peripheral surface of the reel core part 13b by an adhesive 31 according to degree of fixing required for the carrier tape 14. Moreover, as a fixing method of the reel core part 13b of the reel 13, various fixing means can be used in addition to a method of being inserted into the fixing slit 13d and a method of being stuck by the adhesive 31.

In the reel 13 shown in the embodiment, a brittle part 30 positioned in the vicinity of the distal end 14E is formed in the carrier tape 14. The brittle part 30 has strength characteristics of being broken by action of longitudinal tension in excess of a prescribed strength on the carrier tape 14. The strength characteristics are concretely characteristics of satisfying a condition of being surely broken and separated by tension acting on the carrier tape 14 at the time of pitch-feed by a tape feed mechanism of the tape feeder 5, and the prescribed strength described above is determined by actually pitch-feeding and checking the presence or absence of a breakage.

FIGS. 7A to 7D show examples of the brittle part 30 formed in the carrier tape 14. The illustrated carrier tape 14 is configured to stick a cover tape 14e for covering pockets 14b on a base tape 14a in which the pockets 14b for receiving electronic components to be supplied and feed holes 14c to be engaged with feed claws of a sprocket constructing the tape feed mechanism are formed. Pockets 14d shown in FIGS. 7A to 7D show the pockets 14b (effective pockets) with the electronic components received. The end of the carrier tape 14 is provided with an empty pocket part having the predetermined number of continuous pockets 14b (empty pockets) in which the electronic components are not received.

Figure 7A:
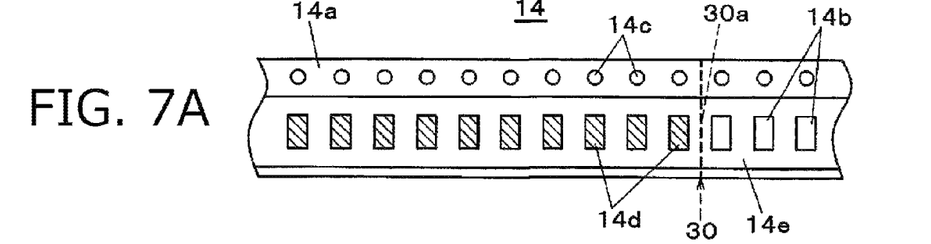
FIGS. 7A to 7D are configuration explanatory diagrams of carrier tapes to be supplied with the component mounting apparatus of the embodiment of the invention.
Figure 7B:
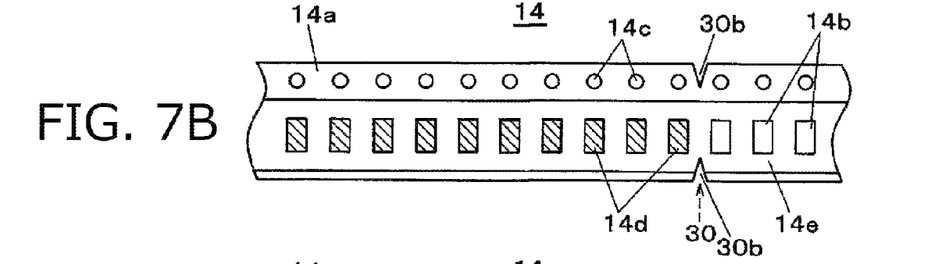

FIGS. 7A and 7B show examples of forming the brittle part 30 at a boundary between the empty pockets and the effective pockets described above in the carrier tape 14. In FIG. 7A, continuous holes 30a obtained by linearly forming plural hole parts by perforation processing etc. in the base tape 14a on which the cover tape 14e is stuck are formed as the brittle part 30. Also, in an example shown in FIG. 7B, V-shaped notched parts 30b formed in both sides of the base tape 14a with the cover tape 14e stuck thereon are formed as the brittle part 30. In both of the examples, the brittle part 30 has lower strength in a tensile direction than that of a normal portion of the carrier tape 14, and the carrier tape 14 is broken in the brittle part 30 by action of tension in excess of the prescribed strength on the carrier tape 14 at the time of tape feed.

Figure 7C:
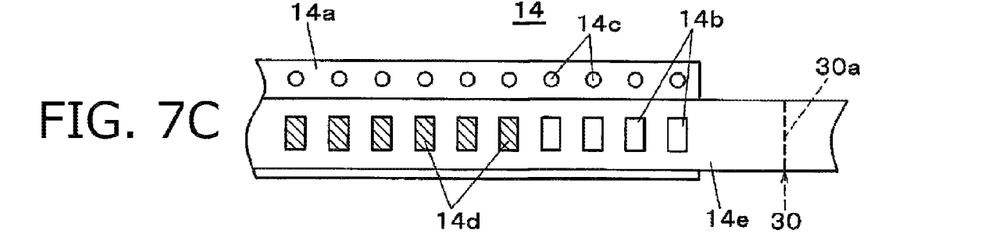
Figure 7D:
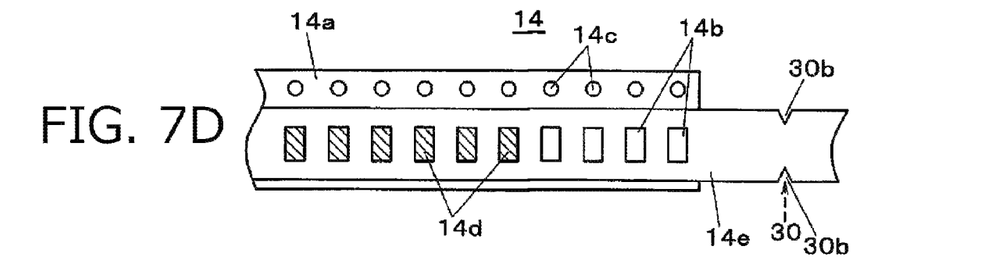

Also, FIGS. 7C and 7D show examples of the brittle part 30 in the case of providing the carrier tape 14 with the cover tape 14e singly extending in a longitudinal direction beyond the end of the base tape 14a. In this case, the distal end of the cover tape 14e is directly fixed to the reel core part 13b in the case of fixing the carrier tape 14 to the reel 13. In FIG. 7C, continuous holes 30a formed in the single cover tape 14e extending out of the base tape 14a like FIG. 7A are formed as the brittle part 30. Also, in the example shown in FIG. 7D, V-shaped notched parts 30b formed in both sides of the single cover tape 14e are formed as the brittle part 30. In the examples shown in FIGS. 7C and 7D, since the brittle part 30 is formed in only the cover tape 14e extending out of the base tape 14a in the carrier tape 14, the strength of the brittle part 30 is lower and the brittle part 30 can be broken by lower tension. Consequently, the carrier tape 14 can be separated more easily and surely in tape pitch-feed.

In both of the examples, the brittle part 30 is positioned and formed in the vicinity of the distal end of the cover tape 14e, and the carrier tape 14 is broken in the brittle part 30 by action of tension in excess of a prescribed strength on the carrier tape 14 at the time of tape feed like the examples shown in FIGS. 7A and 7B. In addition, a form of the brittle part 30 is not limited to the continuous holes 30a and the notched parts 30b, and various mechanical and chemical processing methods for providing strength characteristics of being broken in the case of action of tension in excess of a prescribed strength can be adopted.

Next, a component supplying method in a component mounting apparatus for pulling the carrier tape 14 out of the reel 13 and pitch-feeding and supplying the carrier tape 14 by the tape feeder 5 in the component supply part 4 and picking up a supplied electronic component and mounting the electronic component in a substrate by the mounting head 9 will be described with reference to FIGS. 8A to 8C and FIGS. 9A to 9C. FIGS. 8A to 8C and FIGS. 9A to 9C show a process in which the preceding tape 14(1) fed antecedently and the subsequent tape 14(2) fed subsequently in the two carrier tapes 14 pulled out of the reel 13 and fed in tandem without splicing are sequentially fed along the tape travel path 5c.

Figure 8A:
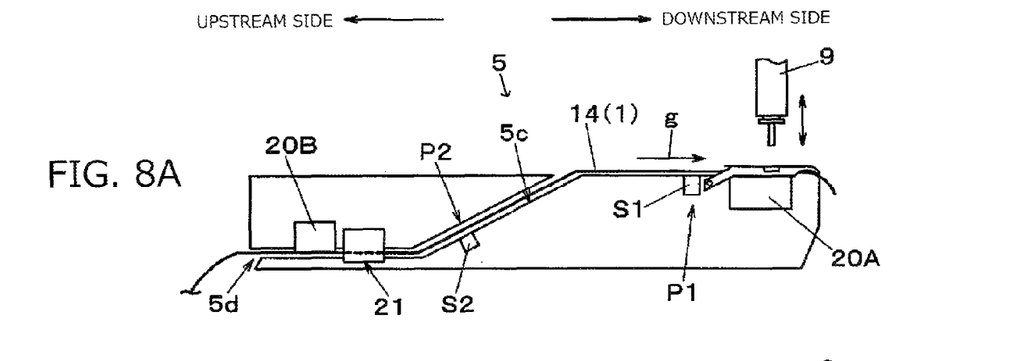
FIGS. 8A to 8C are step explanatory diagrams of a tape feed method in the tape feeder used in the component supply part of the component mounting apparatus of the embodiment of the invention.

First, FIG. 8A shows a state in which component mounting work is being done while the preceding tape 14(1) is fed along the tape travel path 5c. That is, the preceding tape 14(1) is introduced into the tape feeder 5 through the tape inlet 5d and is fed by the first tape feed mechanism 20A (arrow g), and an electronic component is taken out of the preceding tape 14(1) in the component suction position by the mounting head 9.

Figure 8B:
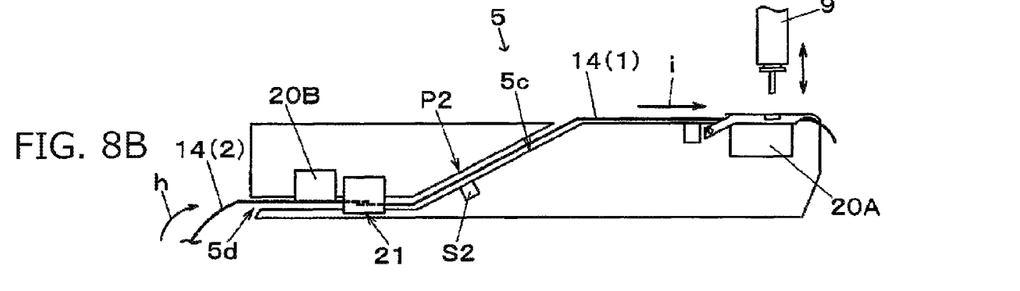

Then, in the process of continuously doing the component mounting work, when the end of component supply from the preceding tape 14(1) approaches, the subsequent tape 14(2) is added and set for component replenishment as shown in FIG. 8B. That is, in a state in which the preceding tape 14(1) engages with the second tape feed mechanism 20B, the head of the subsequent tape 14(2) is introduced from the tape inlet 5d (arrow h), and the subsequent tape 14(2) is fed to the tape stopper mechanism 21 by the second tape feed mechanism 20B. At this time, the tape stopper mechanism 21 permits a tape feed of only the preceding tape 14(1) and prohibits a tape feed of the subsequent tape 14(2).

Then, in this state, the tape feed of the preceding tape 14(1) by the first tape feed mechanism 20A (arrow i) and take-out of the electronic component by the mounting head 9 are performed continuously. At the end of wind-and-store amount of the preceding tape 14(1) in the first reel 13(1) in this process, the preceding tape 14(1) is automatically separated from the first reel 13(1).

Figure 10A:
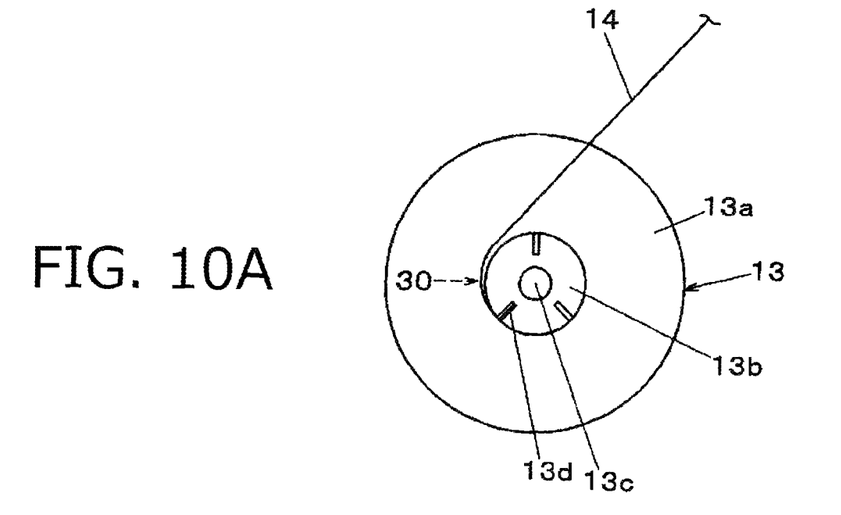
FIGS. 10A and 10B are functional explanatory diagrams of the reel used in the component supply part of the component mounting apparatus of the embodiment of the invention.
Figure 10B:
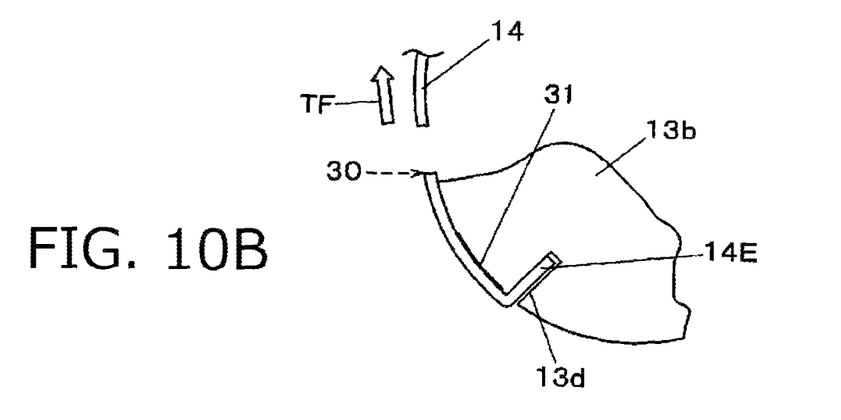

That is, as shown in FIG. 10A, the carrier tape 14 is first pulled out of the reel 13 and thereby, the reel core part 13b to which the distal end 14E of the carrier tape 14 is fixed becomes exposed in the reel 13. When the pitch-feeds of the carrier tape 14 are further repeated, tension TF by the pitch-feed acts on the carrier tape 14 as shown in FIG. 10B since a winding margin of the carrier tape 14 runs out in the reel 13.

Since the brittle part 30 shown in FIG. 6B and FIGS. 7A to 7D is herein formed in the vicinity of the distal end 14E of the carrier tape 14, the carrier tape 14 is separated at the reel core part 13b. Consequently, it is unnecessary to do complicated work, which is used to be required in the case of reel replacement for component replenishment, in which, for example, a worker cuts the vicinity of the distal end 14E of the carrier tape 14 by hand work.

Figure 8C:
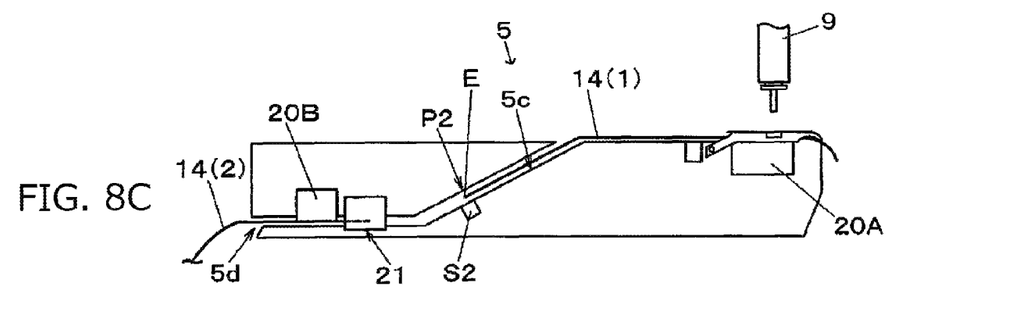
Figure 9A:
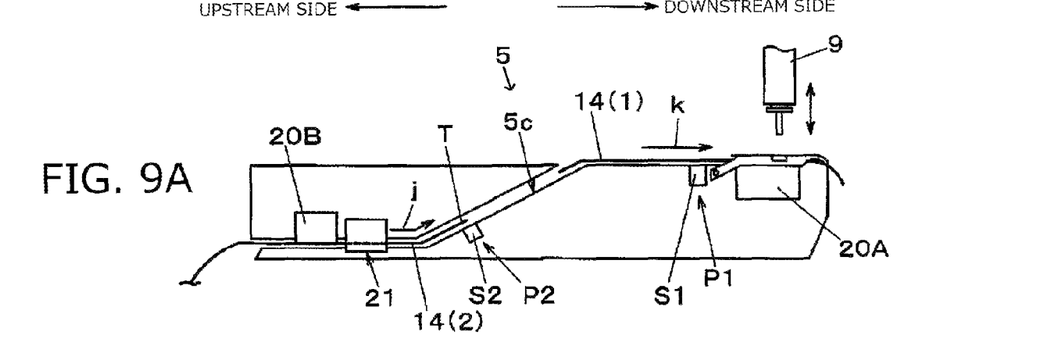
FIGS. 9A to 9C are step explanatory diagrams of the tape feed method in the tape feeder used in the component supply part of the component mounting apparatus of the embodiment of the invention.

After this, when the second tape detecting sensor S2 detects the tail end E of the preceding tape 14(1) as shown in FIG. 8C, as shown in FIG. 9A, the second tape feed mechanism 20B is driven and the subsequent tape 14(2) is fed in order to move the head end T of the subsequent tape 14(2) to the second detecting position P2 (arrow j) and thereafter, the subsequent tape 14(2) is made to wait in this position. Then, in this state, the tape feed of the preceding tape 14(1) by the first tape feed mechanism 20A (arrow k) and take-out of the electronic component by the mounting head 9 are performed continuously.

Figure 9B:
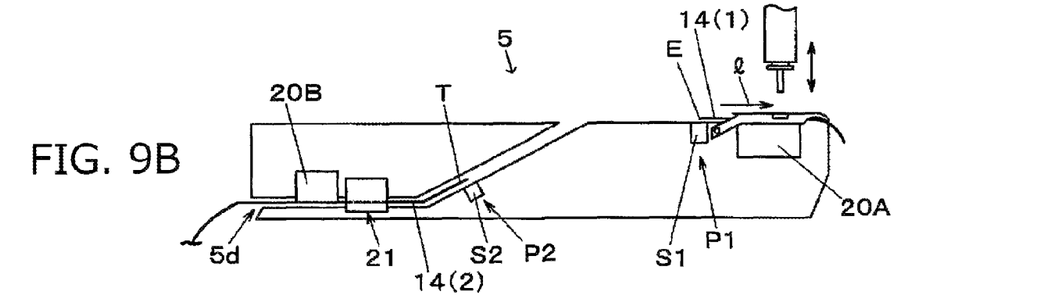
Figure 9C:
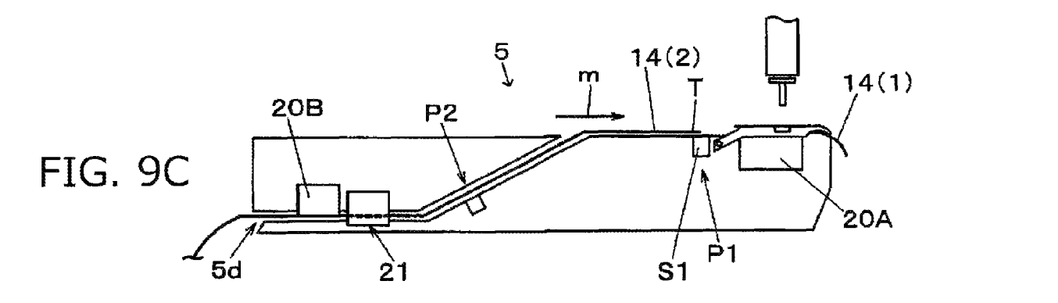

Then, when the first tape detecting sensor S1 detects the tail end E of the preceding tape 14(1) as shown in FIG. 9B in the process of further feeding the preceding tape 14(1) by the first tape feed mechanism 20A (arrow 1), as shown in FIG. 9C, the second tape feed mechanism 20B is driven and the subsequent tape 14(2) is fed in order to move the head end T of the subsequent tape 14(2) from the second detecting position P2 to the first detecting position P1 (arrow m). At the ending of wind-and-store amount of the subsequent tape 14(2) in the second reel 13(2) in this process, the subsequent tape 14(2) is automatically separated from the second reel 13(2) like the example shown in FIGS. 10A and 10B.

As described above, the reel 13 for the component mounting apparatus and the component supplying method in the component mounting apparatus shown in the embodiment are constructed so that the brittle part 30 which is positioned in the vicinity of the distal end 14E fixed to the reel core part 13b of the reel 13 and is broken by action of longitudinal tension in excess of the prescribed strength on the carrier tape 14 is formed in the carrier tape 14. Accordingly, the carrier tape 14 can be separated from the reel core part 13b at the brittle part 30 by the tension acting in the case of pitch-feeding the carrier tape 14, and the carrier tape 14 can easily be separated from the reel core part 13b to which the distal end 14E is fixed. Consequently, it is unnecessary to do complicated work, which is used to be required in the case of reel replacement, in which, for example, a worker cuts the distal end of the carrier tape, and a desired effect can be obtained in the case of adopting a splicing-less feeder for the purpose of improving workability and productivity.

A reel for a component mounting apparatus and a component supplying method in the component mounting apparatus of the embodiment of the invention has an effect capable of easily separating a carrier tape from a reel core part to which the distal end is fixed, and is useful in the component mounting field in which an electronic component is taken out of a tape feeder and is mounted in a substrate.

What is claimed is:

1. A component supplying method in a component mounting apparatus, the method comprising:
   in a component supply part, pulling a carrier tape out of a reel and pitch-feeding and supplying the carrier tape by a tape feeder, the carrier tape including a base tape having a pocket for receiving a component and a cover tape that covers the pocket and is stuck on the base tape, the carrier tape including a distal end fixed to a reel core part of the reel, and a brittle part that is broken by action of longitudinal tension in excess of a prescribed strength on the carrier tape, a part of the carrier tape from the brittle part toward an end of the carrier tape being provided with continuous empty pockets of a predetermined number in which the electronic components are not received, and another part of the carrier tape from the brittle part away from the end of the carrier tape being provided with effective pockets with the electronic components received;
   picking up a supplied component and mounting the component in a substrate by a mounting head; and
   separating the carrier tape from the reel core part at the brittle part by the pitch-feed.

2. The component supplying method of claim 1, wherein the brittle part is continuous holes obtained by linearly forming plural hole parts.

3. The component supplying method of claim 1, wherein the brittle part is V-shaped notched parts formed in both sides of the base tape.

4. A component supplying method in a component mounting apparatus, the method comprising:
   in a component supply part, pulling a carrier tape out of a reel and pitch-feeding and supplying the carrier tape by a tape feeder, the carrier tape including a base tape having a pocket for receiving a component and a cover tape that covers the pocket and is stuck on the base tape, the carrier tape including a distal end fixed to a reel core part of the reel, and a brittle part that is positioned in a vicinity of the distal end and is broken by action of longitudinal tension in excess of a prescribed strength on the carrier tape, a distal end of the cover tape singly extending in a longitudinal direction beyond an end of the base tape being fixed to the reel core part, and the brittle part being positioned and formed in a vicinity of the distal end of the cover tape, a part of the carrier tape at the end of the base tape being provided with continuous empty pockets of a predetermined number in which the electronic components are not received;
   picking up a supplied component and mounting the component in a substrate by a mounting head; and
   separating the carrier tape from the reel core part at the brittle part by the pitch-feed.

5. The component supplying method of claim 4, wherein the brittle part is continuous holes obtained by linearly forming plural hole parts.

6. The component supplying method of claim 4, wherein the brittle part is V-shaped notched parts formed in both sides of the cover tape.

* * * * *